US006781482B2

(12) United States Patent
Laws

(10) Patent No.: US 6,781,482 B2
(45) Date of Patent: Aug. 24, 2004

(54) INTEGRATED CIRCUIT

(75) Inventor: Peter Graham Laws, Swindon (GB)

(73) Assignee: Zarlink Semiconductor Limited (GB)

( * ) Notice: Subject to any disclaimer, the term of this patent is extended or adjusted under 35 U.S.C. 154(b) by 0 days.

(21) Appl. No.: 10/325,254

(22) Filed: Dec. 18, 2002

(65) Prior Publication Data

US 2003/0142459 A1 Jul. 31, 2003

(30) Foreign Application Priority Data

Dec. 19, 2001 (GB) .............................. 0130270

(51) Int. Cl.$^7$ .............................................. H03H 11/04
(52) U.S. Cl. ...................... 333/185; 333/172; 333/175
(58) Field of Search ................... 333/101, 103, 333/172, 185, 175; 361/301.4, 306.3, 311, 313

(56) References Cited

U.S. PATENT DOCUMENTS 5,220,483 A    6/1993  Scott ........................ 257/528

FOREIGN PATENT DOCUMENTS

| EP | 0430404 | 6/1991 | ......... H01L/27/108 |
| EP | 0455340 | 11/1991 | ......... H01L/27/108 |
| WO | WO 01/78093 | 10/2001 | |

Primary Examiner—Robert Pascal
Assistant Examiner—Dean Takaoka
(74) Attorney, Agent, or Firm—Thompson Hine LLP

(57) ABSTRACT

An integrated circuit having a substrate and an LC tank circuit comprises an inductor with parallel capacitors. The capacitors include triple plate integrated capacitors having a highest metal plate, a common middle plate and a lowest metal plate. The lowest plate is connected to a virtual ground node. A control circuit element connected to the middle plate allows the resonant frequency of the tank circuit to be controlled.

22 Claims, 8 Drawing Sheets

Physical Design

Triple plate integrated capacitor

Two plate integrated capacitor
( Prior art )

Single ended LC tank circuit

Triple plate integrated capacitor

Single ended LC tank circuit

Differential LC tank circuit

Differential LC tank circuit with multiple virtual ground nodes

Differential LC tank circuit

Multiple control inputs for differential LC tank circuit

INTEGRATED CIRCUIT

TECHNICAL FIELD

The present invention relates to an integrated circuit. Such an integrated circuit may, for example, contain an inductor/capacitor (LC) circuit forming part of a tuning arrangement for a radio frequency tuner. For instance, such an LC circuit may be provided in the "tank circuit" of a radio frequency (RF) voltage controlled oscillator (VCO) forming a local oscillator of a frequency changer or in an RF LC filter network where it is desirable to achieve a high Q.

BACKGROUND

A known type of integrated circuit VCO LC resonator uses one or more variable capacitance (varactor) diodes to allow the VCO to be tuned over a range of frequencies. However, because the inductive and capacitive components of such an integrated resonator have very wide manufacturing tolerances and because a typical VCO is required to have a relatively wide tuning range, such varactors are required to provide a relatively large capacitance change from their minimum capacitance to their maximum capacitance. As a result, the Q of such LC resonators is limited by varactor diode parasitic resistance. Also, such arrangements have a relatively poor noise performance because of the inherently non-linear varactor diode characteristics which permit noise frequency translation. Further, such VCOs are very sensitive to their frequency control inputs because of the requirement to be able to tune the VCO over a wide frequency range.

FIG. 1 of the accompanying drawings illustrates the physical design, equivalent circuit and circuit symbol of a known type of integrated RF capacitor. The capacitor is formed on a monolithic integrated circuit silicon substrate 1, from which it is isolated by the known type of metalisation dielectric layer 2. The capacitor comprises a "lowest" metal plate 3 and a "highest" metal plate 4 separated from each other by another metalisation dielectric layer 5. The capacitor is covered by a known type of passivation layer 6, which covers the whole integrated circuit. The resulting capacitor 10 is shown connected to terminals T1 and T2, between which it exhibits its intended capacitance within manufacturing tolerances. However, the lowest metal plate 3 also exhibits parasitic resistance and capacitance because of its proximity to the silicon substrate 1. These are illustrated in the equivalent circuit in FIG. 1 as the capacitance Cox between the lowest metal plate 3 and the substrate 1 and by the resistance Rsub and the capacitance Csub of the substrate 1. Thus, if the lowest metal plate carries an RF signal voltage, energy is transferred to the "lossy" silicon substrate 1 and this can result in a degraded noise performance in known types of VCO circuits.

FIG. 2 of the accompany drawings illustrates a known type of LC tuned circuit using capacitors 10a and 10b of the type shown in FIG. 1. The tuned circuit forms a resonator of a tank circuit of a VCO and has a terminal "Tank" for connection to the VCO and a virtual ground terminal Vgnd. The capacitor 10a is connected in parallel with the inductor 11 between the terminals Tank and Vgnd to form a parallel resonant circuit. The capacitor 10b is connected in series with a control circuit element 12 across the inductor 11 and the capacitor 10a. The control circuit element 12 has a "Control" terminal for controlling the operation of the element. For example, the element 12 may comprise a field effect transistor whose source-drain path is connected in series with the capacitor 10b and whose gate terminal comprises the control input. The transistor thus acts as electronic switch to allow the capacitor 10b to be selectively connected in parallel with the inductor 11 and the capacitor 10a so as to provide a switched-tuned circuit which can be selected to have either of two resonant frequencies. Alternatively, the element 12 may comprise a variable capacitance device such as a varactor to provide continuous tuning of the resonant frequency.

When the control circuit element 12 is in anything other than a relatively low impedance state, a signal voltage is present on the lowest plate of the capacitor 10b and, as illustrated in FIG. 1, this results in parasitic energy losses because of the coupling to the substrate 1.

The term "virtual ground node" as used herein is defined to mean an electrical node in a circuit designed to remain at a substantially constant voltage. Such a virtual ground node may, for example, be a node in the circuit where differential signals balance, a power supply line, or a voltage bias node. A virtual ground node includes an actual ground node which is connected to a circuit ground.

SUMMARY

According to the invention, there is provided an integrated circuit comprising a substrate, a frequency-selective circuit including at least one first multiplate capacitor, and a virtual ground node, the or each first multiplate capacitor comprising: a first capacitor comprising a first plate and a second plate disposed between the first plate and the substrate; and a second capacitor comprising the second plate and a third plate disposed between the second plate and the substrate, the virtual ground node being connected to the third plate.

The frequency-selective circuit may comprise an inductor.

The first and second capacitors may be electrically in series with each other.

The first and second capacitors may be connected across the inductor.

The virtual ground node may comprise a ground node.

The third plate may be insulated from the substrate.

The circuit may comprise a or a respective control element connected to the second plate of the or each first multiplate capacitor. The control element or at least one of the control elements may comprise a switch, such as a field effect transistor. As an alternative, the control element or at least one of the control elements may comprise a variable capacitance device such as a variable capacitance diode. The circuit may comprise a plurality of first multiplate capacitors and a plurality of control elements. At least one of the control elements may be arranged to provide stepped control and at least one other of the control elements may be arranged to provide substantially continuous control.

The or each control element may be connected in parallel with the second capacitor.

The circuit may comprise at least one second multiplate capacitor, the or each of which comprises: a third capacitor comprising a fourth plate and a fifth plate disposed between the fourth plate and the substrate; and a fourth capacitor comprising the fifth plate and a sixth plate disposed between the fifth plate and the substrate. The or each control element may be connected between the second plate and the fifth plate of a pair or a respective pair of the first and second multiplate capacitors, respectively. The third and sixth plates may be connected together to form the virtual ground node. The circuit may comprise a further frequency-selective circuit including the third and fourth capacitors.

The circuit may comprise a fifth capacitor comprising a seventh plate connected to the first plate and an eighth plate disposed between the seventh plate and the substrate and connected to the or a further virtual ground node. The circuit may comprise a sixth capacitor comprising a ninth plate connected to the fourth plate and a tenth plate connected to the eighth plate to form the further virtual ground node.

The circuit may comprise a local oscillator having a frequency determining network including the frequency-selective circuit.

The circuit may comprise a filter including the frequency-selective circuit.

The circuit may comprise a radio frequency tuner.

It is thus possible to provide an arrangement which substantially reduces the effects of parasitic elements between capacitors and the substrate of an integrated circuit. By providing a stacked arrangement of two or more capacitors with the lowest plate connected to a virtual ground node, substantially no signal voltage appears on the lowest plate so that substrate losses can be substantially reduced or substantially eliminated. Thus, the Q of tuned circuits including such capacitors can be substantially higher than for known arrangements, for example as shown in FIGS. 1 and 2 of the accompanying drawings. Other disadvantages resulting from the coupling of known capacitors to the silicon substrate can be substantially reduced or eliminated. Thus, for example, the performance of local oscillators and filters in an integrated circuit tuner can be substantially improved.

DETAILED DESCRIPTION

Figure 1:
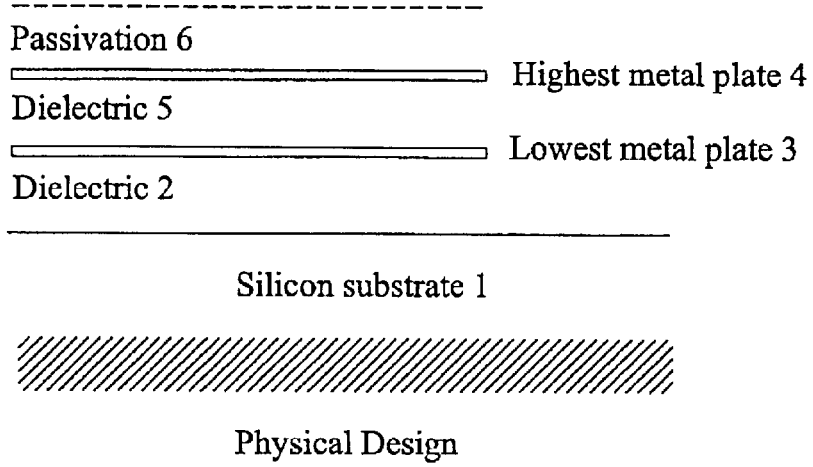
FIG. 1 illustrates diagrammatically the physical design, equivalent circuit and symbol of a known two plate integrated capacitor.
Figure 1:
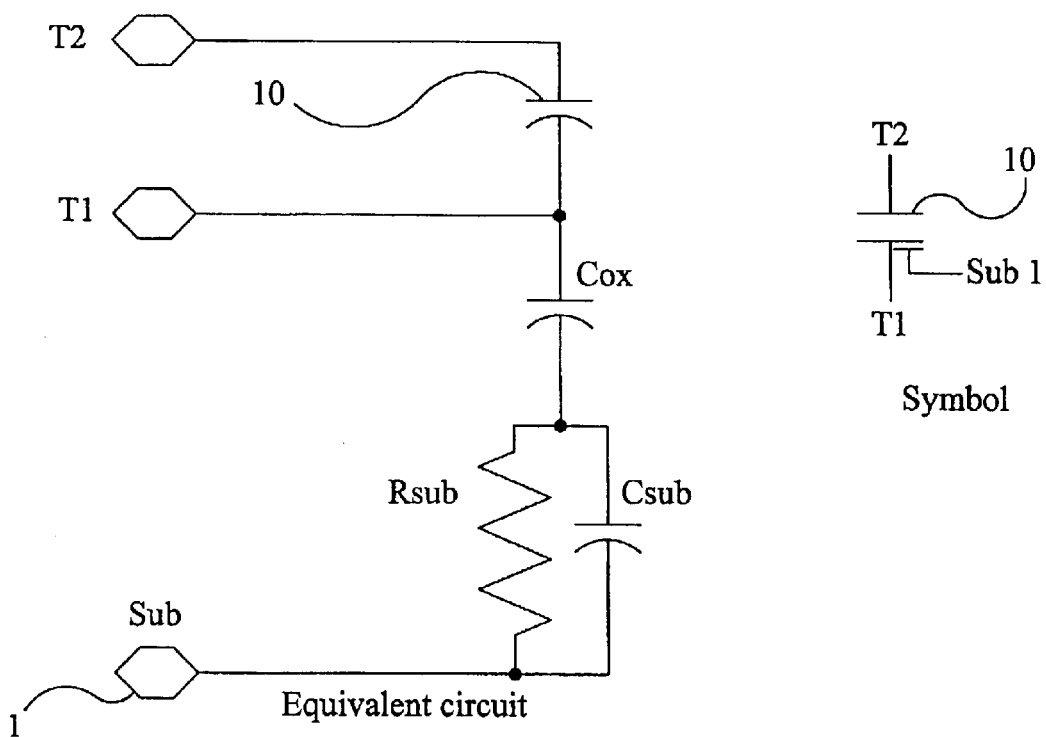
Figure 3:
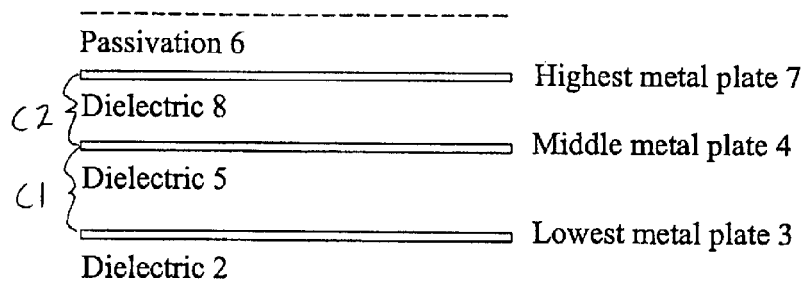
FIG. 3 illustrates diagrammatically the physical design, equivalent circuit and symbol of a triple plate integrated capacitor forming part of an integrated circuit constituting an embodiment of the invention.
Figure 3:
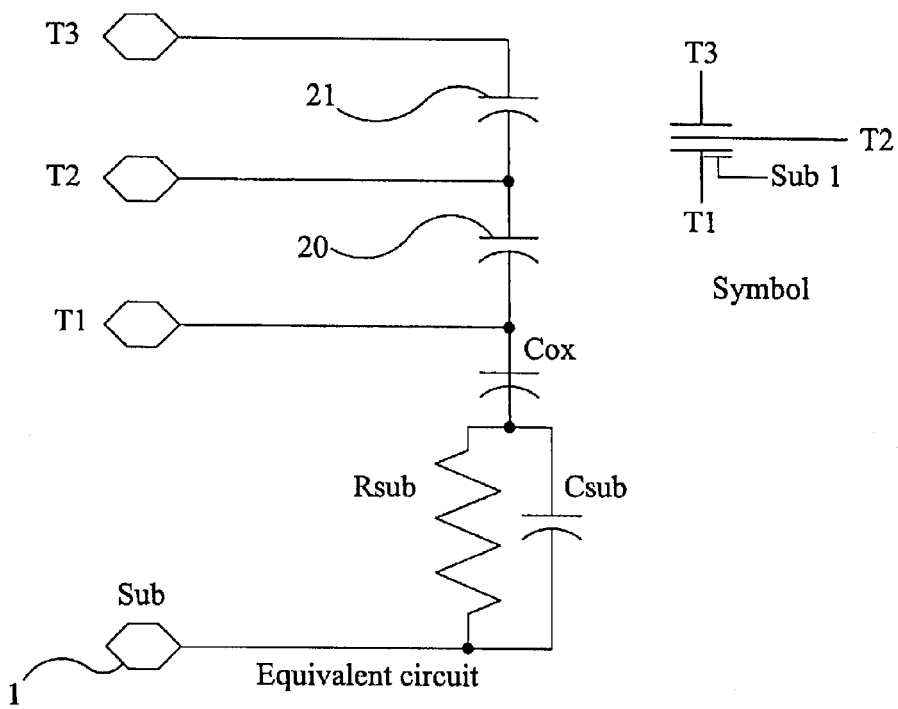

The triple plate capacitor shown in FIG. 3 comprises two capacitors C1 and C2 connected in series forming part of a frequency-selective circuit formed in an integrated circuit. The capacitor C1 comprises a lowest metal plate 3 formed on a dielectric layer 2 above a silicon substrate 1 in the same way as illustrated in FIG. 1. The plate 3 comprises the lower plate of the capacitor C1. The upper plate of the capacitor C1 and the lower plate of the capacitor C2 are formed by a "middle" metal plate 4 separated from the plate 3 by a dielectric layer 5. The upper plate of the capacitor C2 is formed by the highest metal plate 7, which is separated from the plate 4 by another dielectric layer 8 and which is covered by the passivation layer 6.

As shown in the equivalent circuit, the plates 3, 4 and 7 are connected to the terminals T1, T2 and T3, respectively. The triple plate integrated capacitor thus acts as the two capacitors 20 (corresponding to capacitor C1) and 21 (corresponding to capacitor C2) connected in series with the common metal plate 4 being electrically accessible via the terminal T2.

Also as shown in the equivalent circuit, the same parasitic components exist between the lowest metal plate 3 and the substrate 1 as shown in FIG. 1. Thus, the capacitance between the plate 3 and the substrate 1 is illustrated at Cox and the capacitance and resistance of the substrate 1 are illustrated at Csub and Rsub. However, the lowest metal plate 3 is connected via the terminal T1 to a virtual ground node such that little or no signal voltage appears on the lowest metal plate 3. Thus, there is substantially no signal voltage between the lowest metal plate 3 and the substrate 1 so that losses caused by coupling to the substrate 1 are greatly reduced or eliminated.

Figure 2:
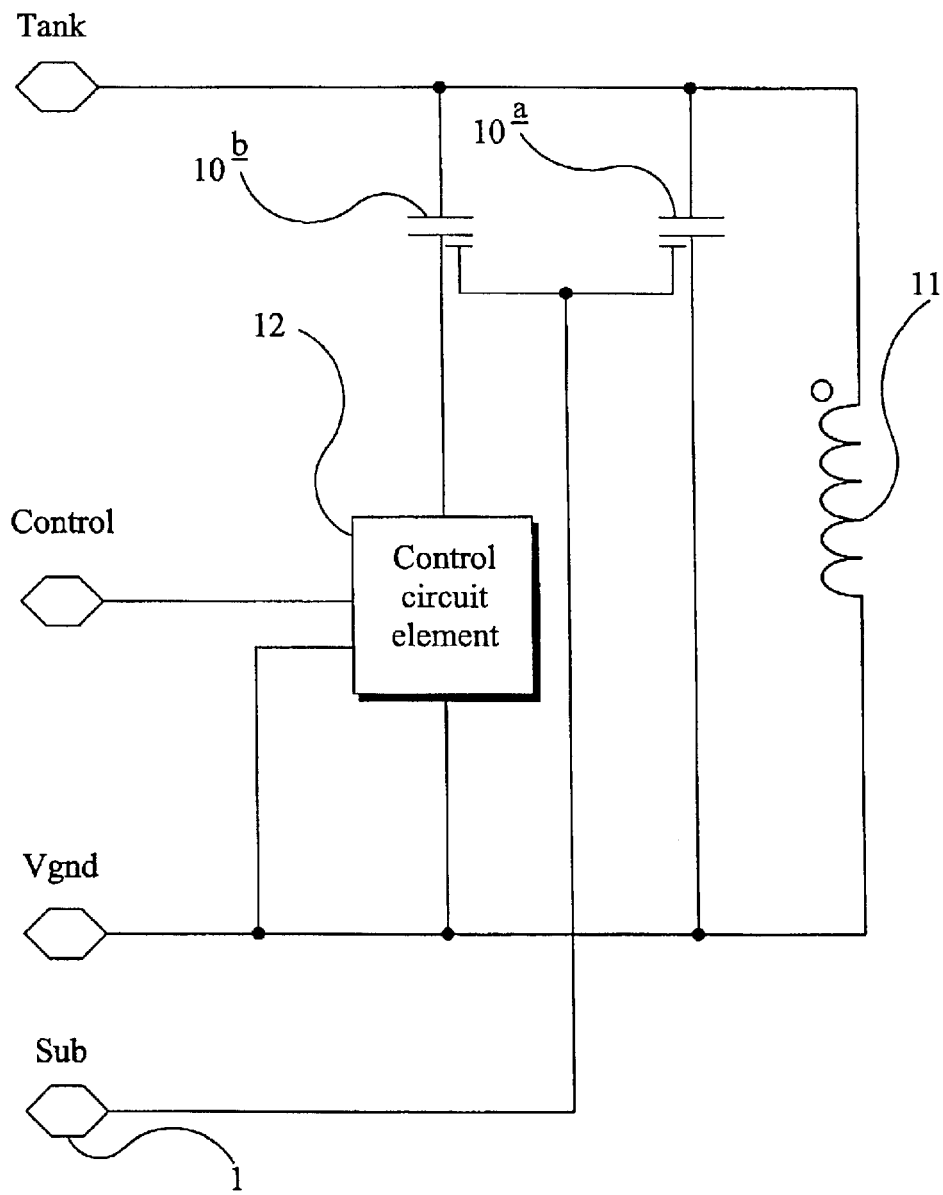
FIG. 2 is a circuit diagram of a single ended LC tank circuit of known type including the capacitor shown in FIG. 1.
Figure 4:
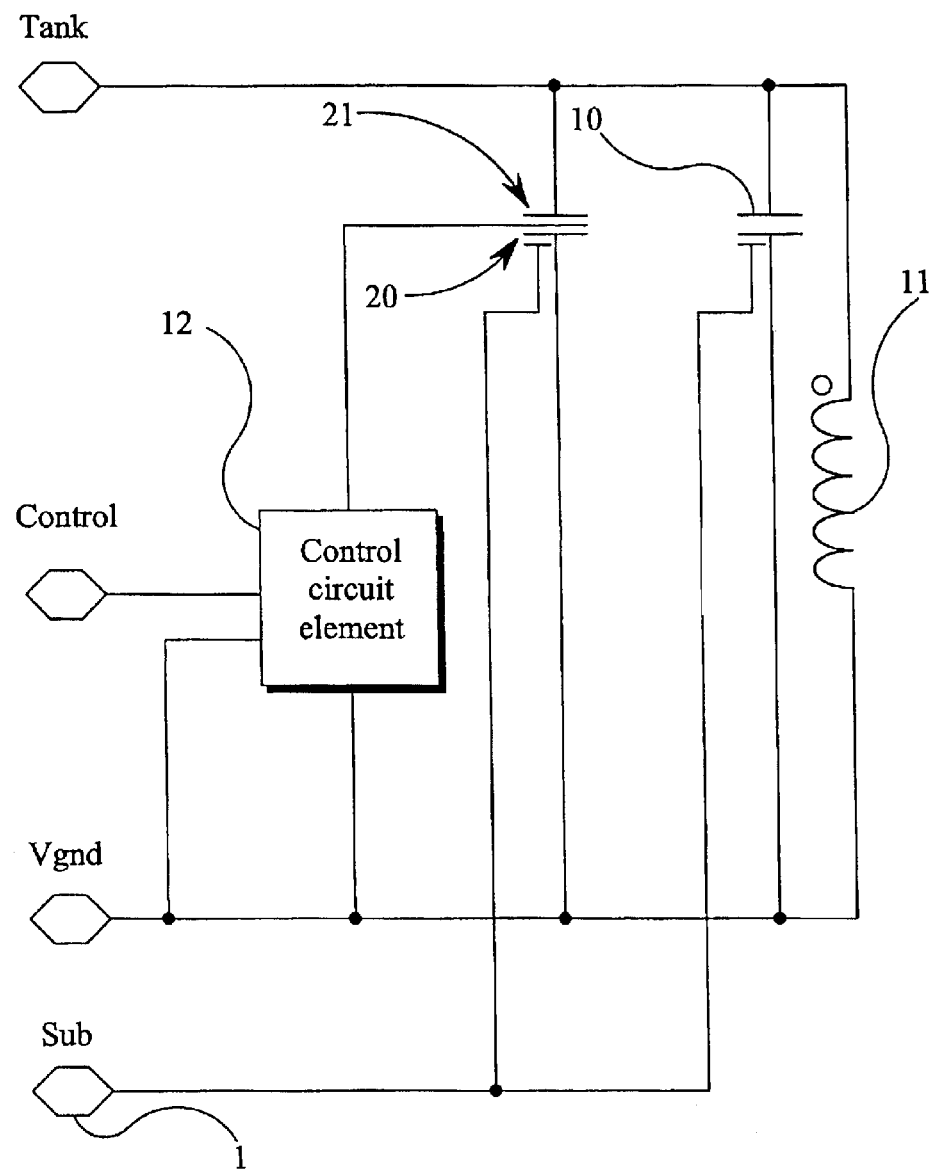
FIG. 4 is a circuit diagram of a single ended LC tank circuit constituting another embodiment of the invention.

FIG. 4 illustrates a tank circuit of a type similar to that shown in FIG. 2 and comprising an inductor 11 and a capacitor 10 of the two plate integrated type shown in FIG. 1. The lowest plate of the capacitor 10 is connected to the virtual ground node Vgnd so that substantially no signal voltage appears between the lowest plate and the substrate 1. The tank circuit also comprises a triple plate integrated capacitor 20, 21 of the type shown in FIG. 3. The lowest plate of the capacitor 20 is also connected to the virtual ground node Vgnd so that, as described hereinbefore, substantially no signal voltage appears between the lowest plate of the capacitor 20 and the substrate 1. Thus, losses caused by coupling between the lower plates of the capacitors 10 and 20 and the substrate 1 are substantially avoided.

The tank circuit shown in FIG. 4 also comprises a control circuit element 12, such as a field effect transistor or a varactor diode as described hereinbefore with reference to FIG. 2. However, the control circuit element 12 is connected to the middle plate, which is common to the capacitors 20 and 21, and is effectively in parallel with the capacitor 20. A signal voltage does appear on the middle plate 4 common to the capacitors 20 and 21 but there is little or no coupling between this plate and the substrate so that substantially no losses occur. The resonant frequency of the tank circuit can be varied, for example by varying the capacitance in parallel with the capacitor 20 or selectively short-circuiting the capacitor 20 by means of the element 12.

Figure 5:
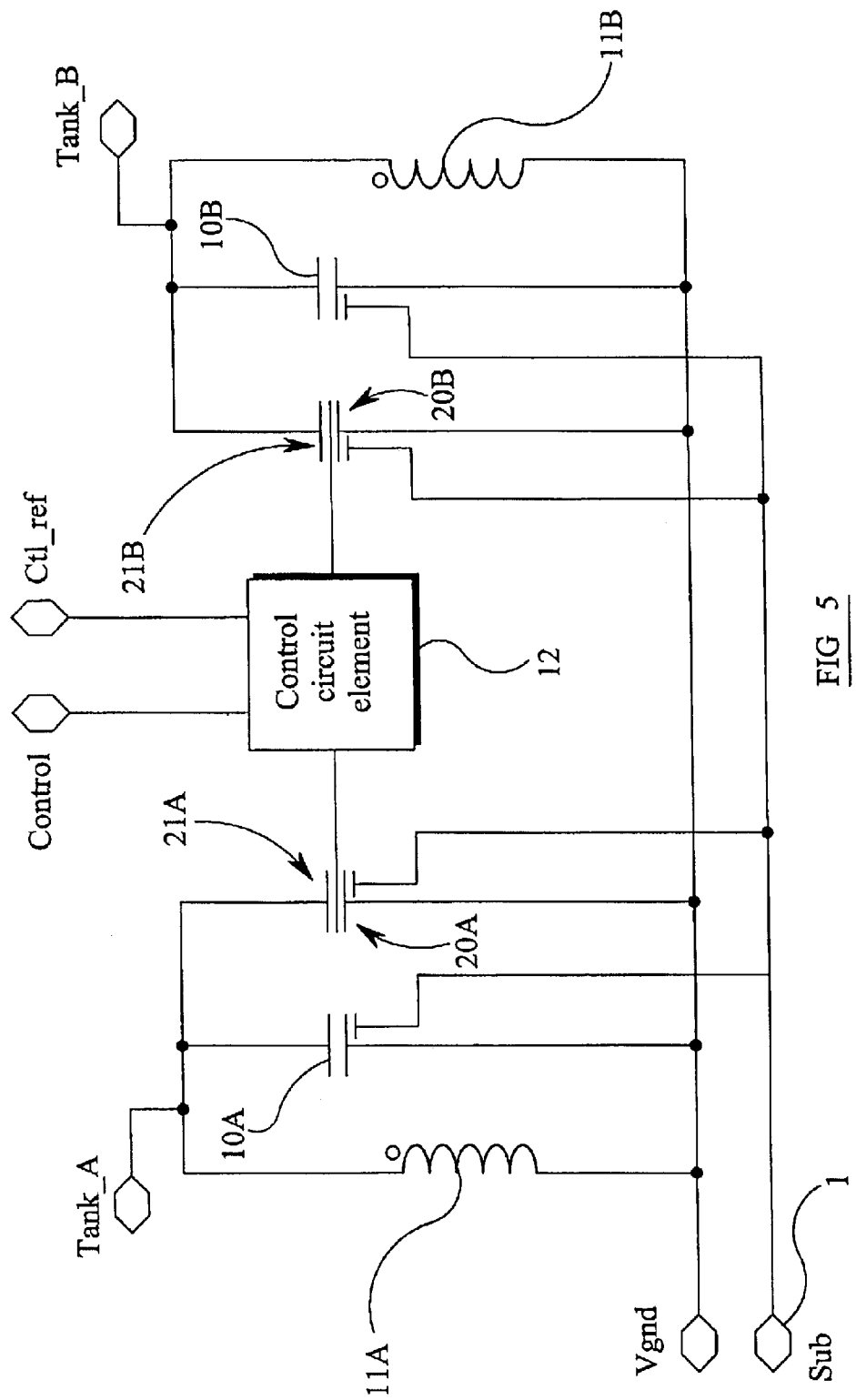
FIG. 5 is a circuit diagram of a differential LC tank circuit constituting a further embodiment of the invention.

FIG. 5 illustrates a differential LC tank circuit comprising a pair of inductors 11a and 11b of substantially the same inductance, a pair of capacitors 10a and 10b of substantially the same capacitance and of the type shown in FIG. 1, and two pairs of capacitors 20A, 21A and 20B, 21B of the type shown in FIG. 3. The capacitors 20A and 20B are of substantially the same capacitance and the capacitors 21A and 21B are of substantially the same capacitance. The tank circuit has terminals Tank A and Tank B. The control circuit element 12 is connected between the middle plates of the triple plate integrated capacitors 20A, 21A and 20B, 21B. Again, all of the lowest metal plates of the capacitors 10A, 10B, 20A and 20B are connected to the virtual ground node Vgnd so that losses caused by coupling to the substrate 1 are greatly reduced or substantially eliminated.

Figure 6:
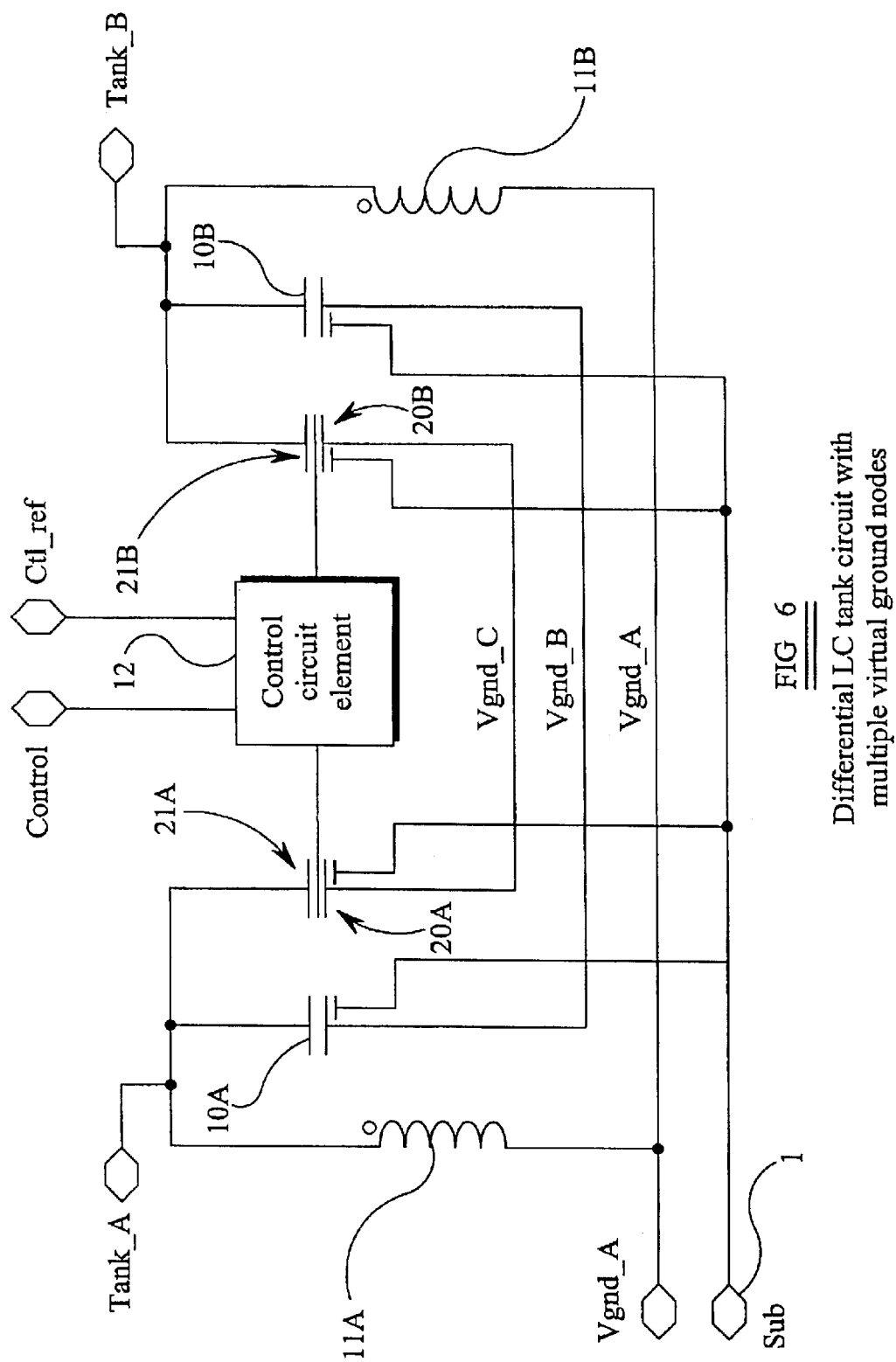
FIG. 6 is a circuit diagram of a differential LC tank circuit with multiple virtual ground nodes constituting another embodiment of the invention.

FIG. 6 illustrates another differential LC tank circuit which differs from that shown in FIG. 5 in that there is a plurality of virtual ground nodes Vgnd A, Vgnd B and Vgnd C. The lower terminals of the inductors 11A and 11B are connected to the virtual ground node Vgnd A, which corresponds to the node Vgnd shown in FIG. 5. The node Vgnd A is a virtual ground node because of its connection to other circuitry (not shown) of the integrated circuit. The lowest plates of the capacitors 10A and 10B are connected together and, because of the balanced or differential nature of the tank circuit, this connection is itself a virtual ground node Vgnd B. Similarly, the lowest plates of the capacitors 20A and 20B are connected together and automatically form a virtual ground node Vgnd C. An arrangement of this type may have advantages in terms of the actual layout of interconnections in the integrated circuit.

Figure 7:
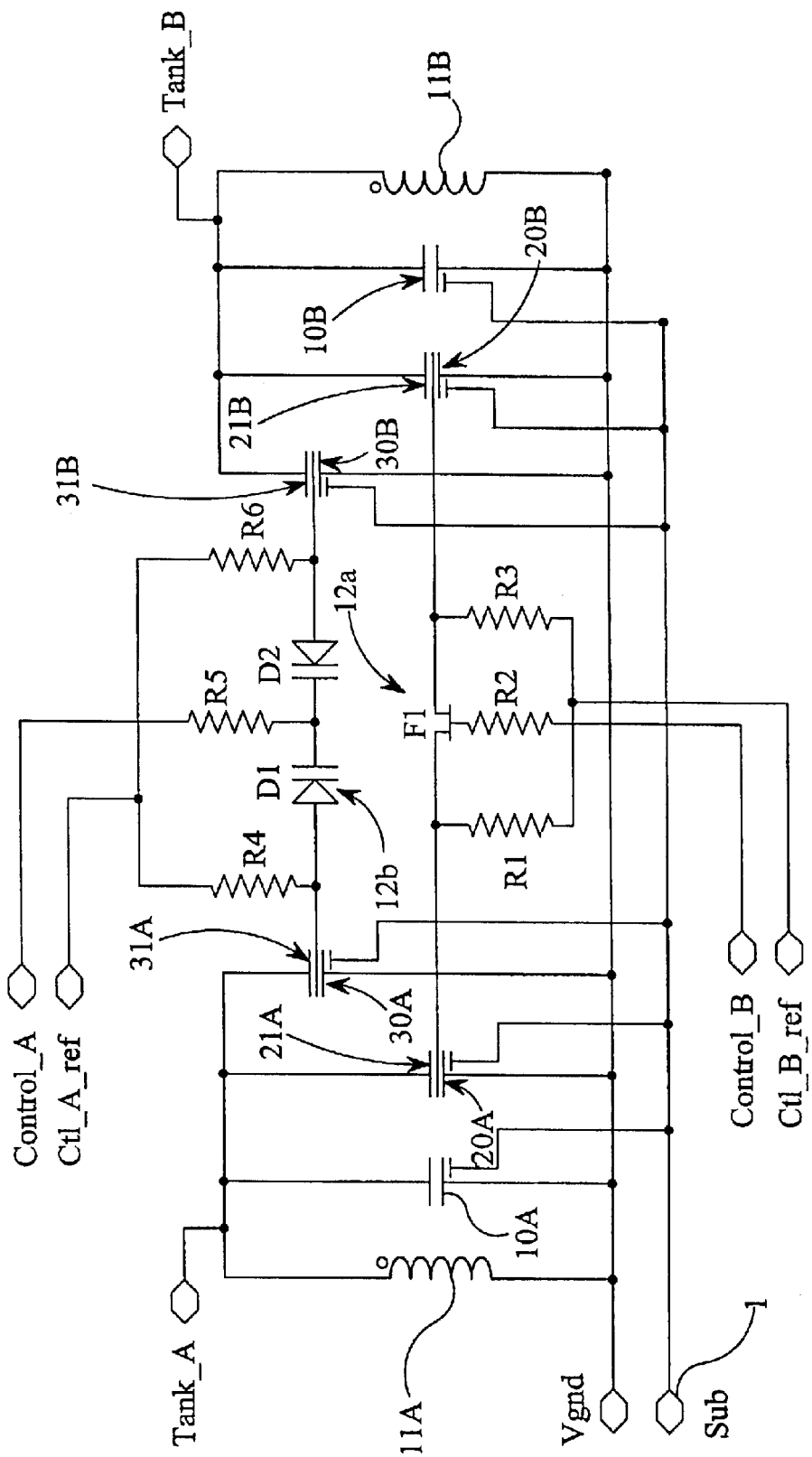
FIG. 7 is a circuit diagram of a differential LC tank circuit with coarse and fine tuning constituting a further embodiment of the invention.

FIG. 7 illustrates another differential LC tank circuit which is similar to that shown in FIG. 5 but which comprises a further pair of triple plate integrated capacitors 30A, 31A and 301B, 31B with two control circuit elements 12a and 12b. Again, the lowest plates of the capacitors 30A and 30B are connected to the virtual ground node Vgnd. However, FIG. 7 illustrates two different types of control circuit elements 12a and 12b for providing switched and continuous variation, respectively, in the resonant frequency of the tank circuit.

The control circuit element 12a provides switched changes and comprises a field effect transistor F1 and resistors R1, R2 and R3 connected to a Control B input and to a Control B reference. Depending on the control signal supplied to the field effect transistor F1, the drain-source path thereof can have a very low impedance or a very high impedance corresponding to a switch being closed or open, respectively. This arrangement provides for step changes in the tank circuit resonant frequency.

The control circuit element 12b likewise receives a control signal at a Control A input referred to a Control A reference. The element 12b comprises varactor diodes D1 and D2 connected "back-to-back" between the middle plates common to the capacitors 30A, 31A and 30B, 311B. The diodes D1 and D2 are connected via resistors R4, R5 and R6 to the control A inputs and allow the same variable voltage to be applied across the diodes. Thus, within manufacturing tolerances, the diodes D1 and D2 present substantially the same variable capacitances and this allows continuous tuning of the resonant frequency of the tank circuit.

The tank circuit shown in FIG. 7 provides a single coarse adjustment of resonant frequency by means of the switching element 12a and a single fine or continuous tuning arrangement provided by the control element 12b. However, a plurality of coarse or switched tuning steps may be provided by adding additional field effect transistors or other electronic switches and pairs of triple plate capacitors. Also, although the switching elements are shown as field effect transistors, as indicated earlier, other devices may be used for performing the switching function. For example, a controllable capacitance element, which can be switched between high and low capacitance states, may be used such that the high capacitance state presents a relatively low impedance and the low capacitance state presents a relatively high impedance at the frequencies for which the circuit is intended. Also, although only one fine or continuous tuning arrangement would commonly be provided, more than one fine tuning arrangement may be provided if necessary or desirable. Further, all such arrangements may be provided in single ended as well as differential tank circuits and in other applications, such as signal filtering.

Figure 8:
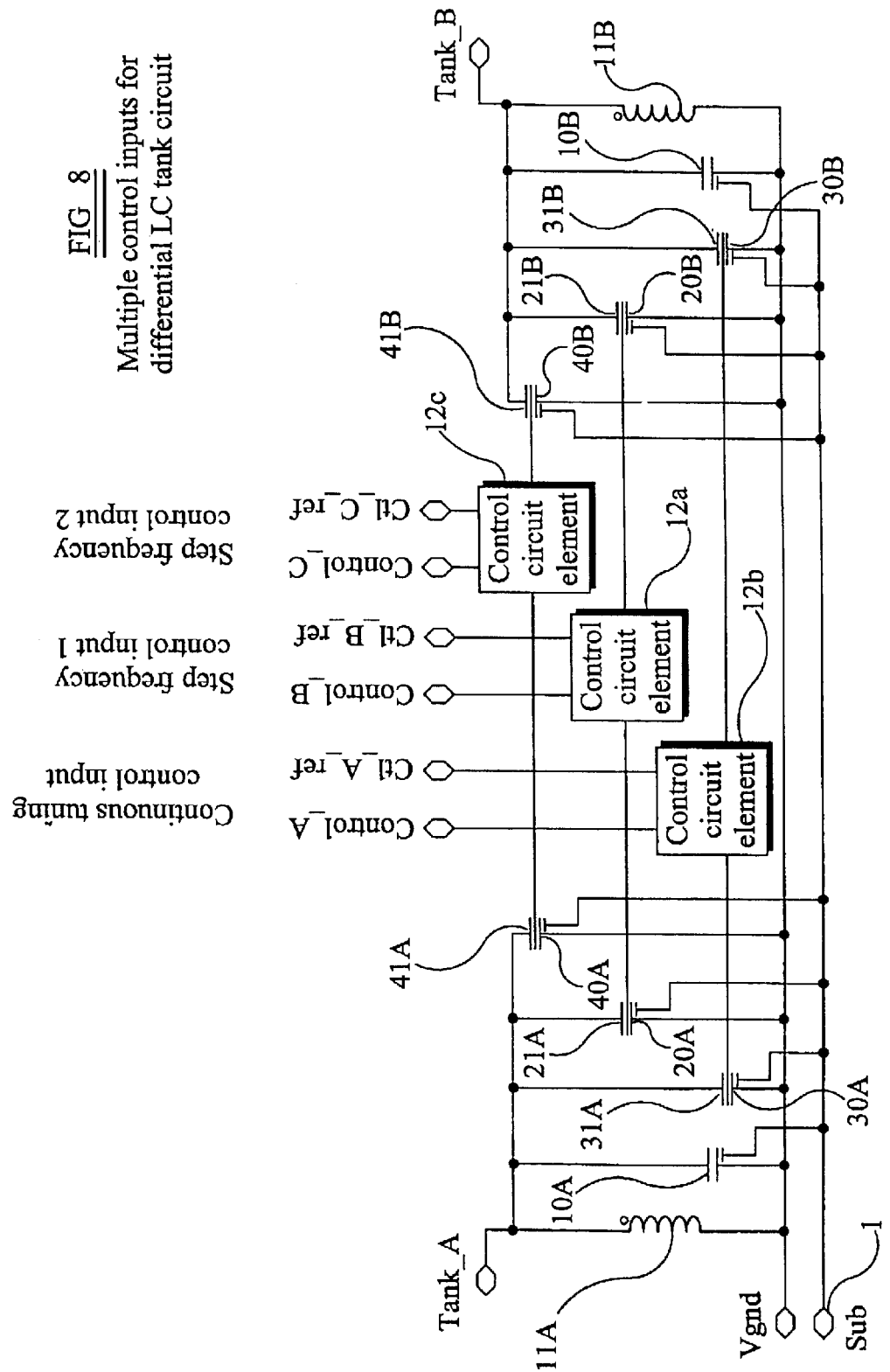
FIG. 8 is a circuit diagram of a differential LC tank circuit, with two stages of coarse tuning and with fine tuning, constituting yet another embodiment of the invention.

For example, FIG. 8 illustrates another differential tank circuit of the type shown in FIG. 5 and with the additional triple plate capacitors 30A, 31A and 30B, 31B and control circuit element 12b as shown in FIG. 7. However, the tank circuit of FIG. 8 provides two step frequency controls with additional triple plate capacitors 40A, 41A and 40B, 41B and an additional control circuit element 12c having independent control and reference inputs Control C and Control C reference. The control circuit elements 12a and 12b may be of the type shown in FIG. 7 and the control circuit element 12c may also be of the same type as the element 12a.

The control elements 12a and 12c may be controlled in such a way that their associated triple plate capacitors are either both switched out of circuit or are switched in circuit one at a time. However, it is also possible to provide a further step by allowing both of the elements 12a and 12c to switch there associated capacitors into circuit at the same time. The switched elements may thus be controlled so as to provide three or four coarsely selected frequency ranges with the continuous element 12b having a range such that three or four contiguous or overlapping frequency ranges are provided.

What is claimed is:

1. An integrated circuit comprising a substrate, a frequency-selective circuit including at least one first multiplate capacitor, and a virtual ground node, said at least one first multiplate capacitor comprising: a first capacitor comprising a first plate and a second plate disposed between said first plate and said substrate; and a second capacitor comprising said second plate and a third plate disposed between said second plate and said substrate, said virtual ground node being connected to said third plate, said first and second capacitors being electrically in series with each other.

2. A circuit as claimed in claim 1, in which said frequency-selective circuit comprises an inductor.

3. A circuit as claimed in claim 2, in which said first and second capacitors are electrically connected in series with each other across said inductor.

4. A circuit as claimed in claim 1, comprising a radio frequency tuner.

5. A circuit as claimed In claim 1, in which said virtual ground node comprises a ground node.

6. A circuit as claimed in claim 1, in which said third plate is insulated from the said substrate.

7. A circuit as claimed in claim 1, comprising at least one control element connected to said second plate of said at least one first multiplate capacitor.

8. A circuit as claimed in claim 7, in which said at least one control element comprises a switch.

9. A circuit as claimed in claim 8, in which said switch is a field effect transistor.

10. A circuit as claimed in claim 7, in which said at least one control element comprises a variable capacitance device.

11. A circuit as claimed in claim 10, in which said device is a variable capacitance diode.

12. A circuit as claimed in claim 7, in which said at least one first multiplate capacitor comprises a plurality of first multiplate capacitors and said at least one control element comprises a plurality of control elements.

13. A circuit as claimed in claim 12, in which at least one of said control elements is arranged to provided stepped control and at least one other of said control elements is arranged to provide substantially continuous control.

14. A circuit as claimed in claim 7, in which said at least one control element is connected in parallel with said second capacitor.

15. A circuit as claimed in claim 1, comprising at least one second multiplate capacitor, which comprises: a third capacitor comprising a fourth plate and a fifth plate disposed between said fourth plate and said substrate; and a fourth capacitor comprising said the fifth plate and a sixth plate disposed between said fifth plate and said substrate.

16. A circuit as claimed in claim 15, comprising at least one control element connected between said second plate and said fifth plate of said at least one first and said at least one second multiplate capacitors, respectively.

17. A circuit as claimed in claim 15, in which said third and sixth plates are connected together to form said virtual ground node.

18. A circuit as claimed in claim 15, comprising a further frequency-selective circuit including said third and fourth capacitors.

19. A circuit as claimed in claim 1, comprising a fifth capacitor comprising a seventh plate connected to said first plate and an eighth plate disposed between said seventh plate and said substrate and connected to said virtual ground node.

20. A circuit as claimed in claim 15, comprising: a fifth capacitor comprising a seventh plate connected to said first plate and an eighth plate disposed between said seventh plate and said substrate; and a sixth capacitor comprising a ninth plate connected to said fourth plate and a tenth plated connected to said eighth plate.

21. A circuit as claimed in claim 1, comprising a local oscillator having a frequency determining network including said frequency-selective circuit.

22. A circuit as claimed in claim 1, comprising a filter including said frequency-selective circuit.

* * * * *